(12) United States Patent
Ikeda et al.

(10) Patent No.: US 8,969,771 B2
(45) Date of Patent: Mar. 3, 2015

(54) IMAGING SYSTEM AND IMAGING DEVICE

(75) Inventors: Yasuji Ikeda, Kawasaki (JP); Hiroki Hiyama, Sagamihara (JP); Kazuo Yamazaki, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 370 days.

(21) Appl. No.: 13/504,471

(22) PCT Filed: Dec. 20, 2010

(86) PCT No.: PCT/JP2010/073641
§ 371 (c)(1),
(2), (4) Date: Apr. 26, 2012

(87) PCT Pub. No.: WO2011/086845
PCT Pub. Date: Jul. 21, 2011

(65) Prior Publication Data
US 2012/0211643 A1    Aug. 23, 2012

(30) Foreign Application Priority Data

Jan. 13, 2010 (JP) ................. 2010-005153
Jul. 29, 2010 (JP) ................. 2010-171177

(51) Int. Cl.
*H01L 27/146* (2006.01)
*H04N 5/378* (2011.01)
(Continued)

(52) U.S. Cl.
CPC ............. *H04N 5/378* (2013.01); *H03M 1/0607* (2013.01); *H03M 1/162* (2013.01); *H03M 1/54* (2013.01)
USPC ............. 250/208.1; 250/214 R; 250/214 DC; 341/166; 348/303

(58) Field of Classification Search
CPC ......... H03M 1/06; H03M 1/12; H03M 1/126; H03M 1/82; H01L 27/146; H04N 5/335; H04N 5/3355; H04N 5/355; H04N 5/378
USPC ................. 250/208.1, 214 R, 214 C, 214 DC; 341/155, 166; 348/302, 303, 308, 320, 348/322
See application file for complete search history.

(56) References Cited

U.S. PATENT DOCUMENTS 5,565,869 A    10/1996  Brodie et al.
6,255,971 B1 *  7/2001  Van de Plassche et al. .. 341/120
(Continued)

FOREIGN PATENT DOCUMENTS

CN    101237236 A    8/2008
JP    2005-348325 A    12/2005
(Continued)

OTHER PUBLICATIONS
Korean Office Action dated Aug. 27, 2013, issued in related Korean Patent Application No. 10-2012-7019410.
(Continued)

*Primary Examiner* — Kevin Pyo
(74) *Attorney, Agent, or Firm* — Fitzpatrick, Cella, Harper & Scinto

(57) ABSTRACT

An imaging system includes an A/D converter including a holding unit holding a pixel signal as a voltage level, a comparator comparing the voltage level held with a reference level, a circuit capable of changing the voltage level so as to approach the reference level at first and second rates, wherein the voltage level is changed at the first rate to determine higher bits in accordance with inversion of a relationship between the reference level and the voltage level, after that, the voltage level is changed at the second rate to determine lower bits in accordance with inversion of the relationship between the reference level and the voltage level, and an adjusting unit which adjusts the voltage level during a period until the voltage level is changed at the second rate after determination of the higher bits so that the lower bits and the voltage level hold a linear relationship.

10 Claims, 12 Drawing Sheets

(51) Int. Cl.
*H03M 1/06* (2006.01)
*H03M 1/16* (2006.01)
*H03M 1/54* (2006.01)

(56) References Cited

U.S. PATENT DOCUMENTS

| | | | |
|---|---|---|---|
| 7,626,532 B2 | 12/2009 | Maruyama | |
| 7,642,947 B2 | 1/2010 | Suzuki et al. | |
| 8,427,565 B2 | 4/2013 | Hiyama | |
| 2009/0021411 A1 | 1/2009 | Maruyama | |
| 2009/0108571 A1 | 4/2009 | Sato et al. | |
| 2009/0251578 A1* | 10/2009 | Yamashita | 348/302 |
| 2010/0253821 A1* | 10/2010 | Yamamoto | 348/294 |

FOREIGN PATENT DOCUMENTS

| | | |
|---|---|---|
| JP | 2009-239694 A | 10/2009 |
| KR | 10-2008-0083573 A | 9/2008 |
| WO | 2009/119270 A1 | 10/2009 |

OTHER PUBLICATIONS

PCT International Search Report and Written Opinion of the International Searching Authority, mailed Mar. 29, 2011, in PCT/JP2010/073641.

Chinese Office Action dated Aug. 5, 2014, issued in corresponding Chinese Patent Application No. 201080061022.9.

* cited by examiner

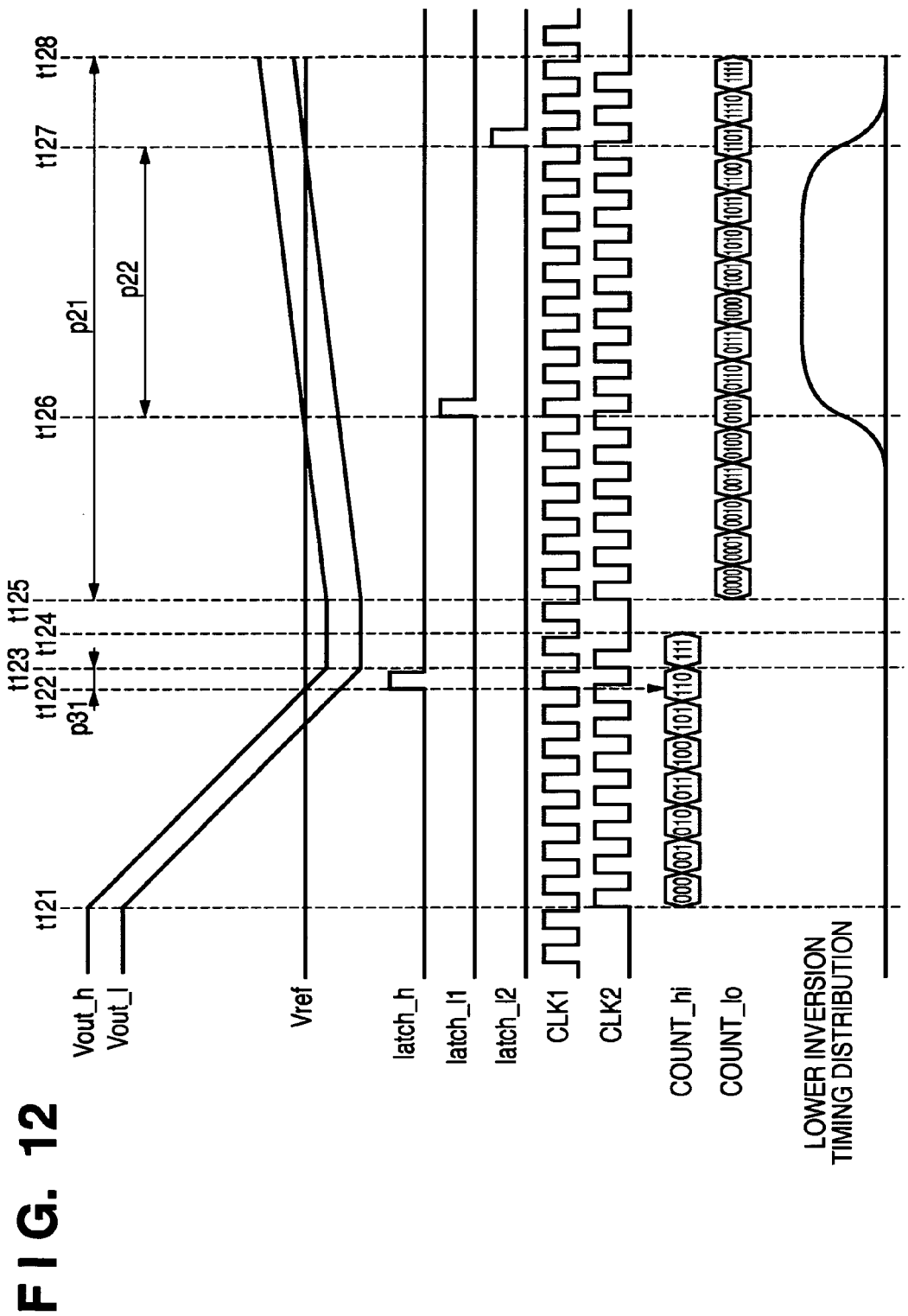

IMAGING SYSTEM AND IMAGING DEVICE

TECHNICAL FIELD

The present invention relates to an imaging system and an imaging device.

BACKGROUND ART

An example of the A/D (Analog to Digital) converting method used in recent imaging devices is a method called column A/D which installs an A/D converter for each pixel column of an image sensor. An example of A/D conversion used in column A/D is an integrating type A/D conversion. Japanese Patent Laid-Open No. 2005-348325 discloses in particular a multi-step scheme which performs A/D conversion in two or more steps divisionally for higher and lower bits.

Japanese Patent Laid-Open No. 2005-348325 discloses an imaging device including sensing elements arranged in a two-dimensional array, and A/D converters provided in a one-to-one-correspondence with the columns of sensing elements. In this imaging device, each A/D converter holds, in a storage unit, an electrical signal corresponding to the analog signals of sensing elements as an initial value. The storage unit is charged or discharged by a first fixed signal input after that. Time is discretely measured from the start of charge or discharge until the electrical signal in the storage unit reaches a reference signal. The storage unit is discharged or charged by a second fixed signal input after that. The time until the electrical signal in the storage unit which has exceeded the reference signal, after the measurement reaches the reference signal, is discretely measured as a digital value. More specifically, the output from an integrator is set as a pixel signal voltage, and integration then starts as a negative slope. At a certain time, the output of the integrator falls below the reference voltage, and A/D conversion of N higher bits ends. Integration is temporarily interrupted at the end. However, since switches are controlled in discrete time, the difference between the integrator output and the reference voltage is not 0, and a potential difference (residual signal) exists between them. In the next step, the first potential difference is integrated again, thereby converting M lower bits. At a certain time later, the output of the integrator intersects the reference voltage of the comparator, and A/D conversion of M lower bits ends.

However, in the above-described prior art, if the residual signal that is the difference between the reference voltage and the integrator output after higher conversion contains an offset caused by leakage, delay, or the like, determination may be unable to finish until the end of the lower count period, or conversely, the output from the comparator may be inverted before lower conversion count. In this case, the conversion linearity becomes more poor.

SUMMARY OF INVENTION

The present invention provides a technique advantageous for adjusting the linearity of a voltage level input to an A/D converting circuit and a digital signal output from the A/D converting circuit.

The first aspect of the present invention provides an imaging system including a plurality of pixels arranged in a matrix each of which outputs a pixel signal corresponding to incident light, and a plurality of A/D converting circuits provided in correspondence with columns of the plurality of pixels, the A/D converting circuit comprising: a holding unit which holds the pixel signal as a voltage level; a comparator which compares the voltage level held by the holding unit with a reference level; a circuit capable of changing the voltage level held by the holding unit so as to approach the reference level at one of a first rate and a second rate lower than the first rate, wherein the voltage level of the pixel signal held by the holding unit is changed by the circuit at the first rate, higher bits are determined in accordance with inversion of a relationship between the reference level and the voltage level held by the holding unit, after that, the voltage level held by the holding unit is changed at the second rate, and lower bits are determined in accordance with inversion of the relationship between the reference level and the voltage level held by the holding unit; and an adjusting unit which adjusts the voltage level held by the holding unit during a period until the voltage level held by the holding unit is changed at the second rate after determination of the higher bits so that the lower bits and the voltage level held by the holding unit hold a linear relationship throughout a possible range of the voltage level held by the holding unit after determination of the higher bits.

Further features of the present invention will become apparent from the following description of exemplary embodiments with reference to the attached drawings.

BRIEF DESCRIPTION OF DRAWINGS

FIG. 12 is a timing chart showing the driving timing according to the fifth embodiment.

DESCRIPTION OF EMBODIMENTS

Figure 1:
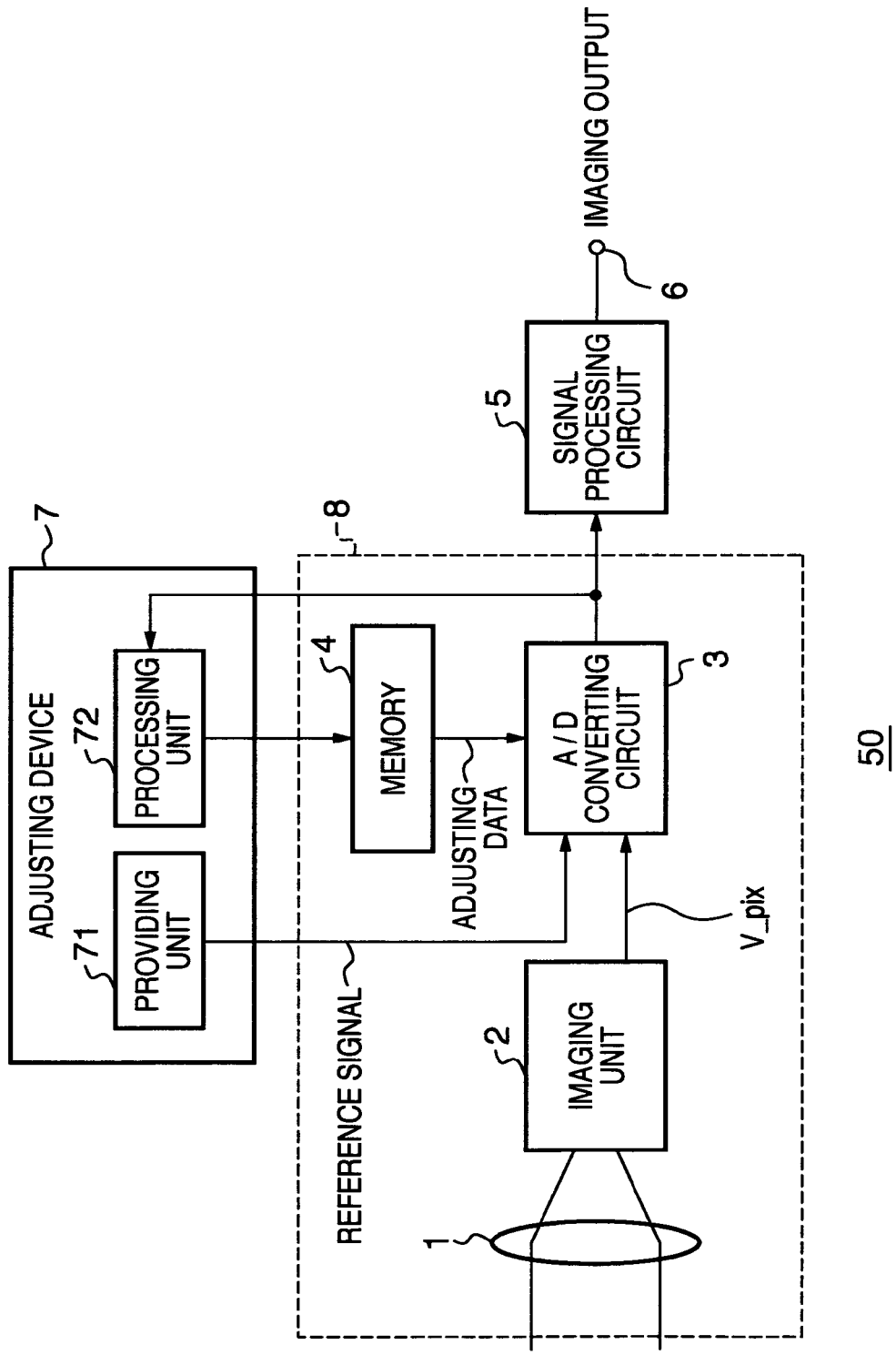
FIG. 1 is a block diagram showing an imaging system to which the present invention is applied.

FIG. 1 illustrates an imaging system according to an embodiment of the present invention. Referring to FIG. 1, an imaging system 50 includes an optical system 1, an imaging device 8, an adjusting device 7 constructing an adjusting unit or adjusting circuit, and a signal processing circuit 5. The optical system 1 may be a part of the imaging device 8. The imaging device 8 includes an imaging unit 2, A/D converting circuit 3, and memory 4. The optical system 1 forms an image of an object on the imaging plane of the imaging unit 2. The imaging unit 2 is a solid-state image sensor such as a CMOS image sensor or a CCD image sensor. The imaging unit 2 has, on its imaging plane, pixels arranged in a two-dimensional array, that is, in a matrix formed from a plurality of rows and a plurality of columns. Each pixel includes a photoelectric conversion element which generates a pixel signal in accordance with incident light. The signal of an image sensed by the imaging unit 2 is output from it as an analog pixel signal V_pix. The A/D converting circuit 3 converts the analog pixel signal V_pix output from the imaging unit 2 into a digital signal and outputs it. The signal processing circuit 5 processes the digital signal output from the A/D converting circuit 3 and outputs the processed digital signal from an output terminal 6.

The circuits including the imaging unit 2 and the A/D converting circuit 3 may be formed either on one semiconductor chip or on a plurality of semiconductor chips. At least the pixel array of the imaging unit 2 and the A/D converting circuit are formed on a single semiconductor chip. The memory 4 may also be formed on the same semiconductor chip as that of the imaging unit 2. When the imaging unit 2 and the A/D converting circuit 3 are formed on one semiconductor chip, an A/D converting circuit may be provided for one or a plurality of pixel columns. Alternatively, there may be provided A/D converting circuits equal in number to the pixel signal outputs, or any other form may be adopted.

The adjusting device 7 includes a providing unit 71 which provides a plurality of reference signal to the A/D converting circuit 3, and a processing unit 72 which stores adjusting data in the memory 4. Note that, for example, a nonvolatile memory or a volatile memory backed up by a battery is used as the memory 4.

Figure 2:
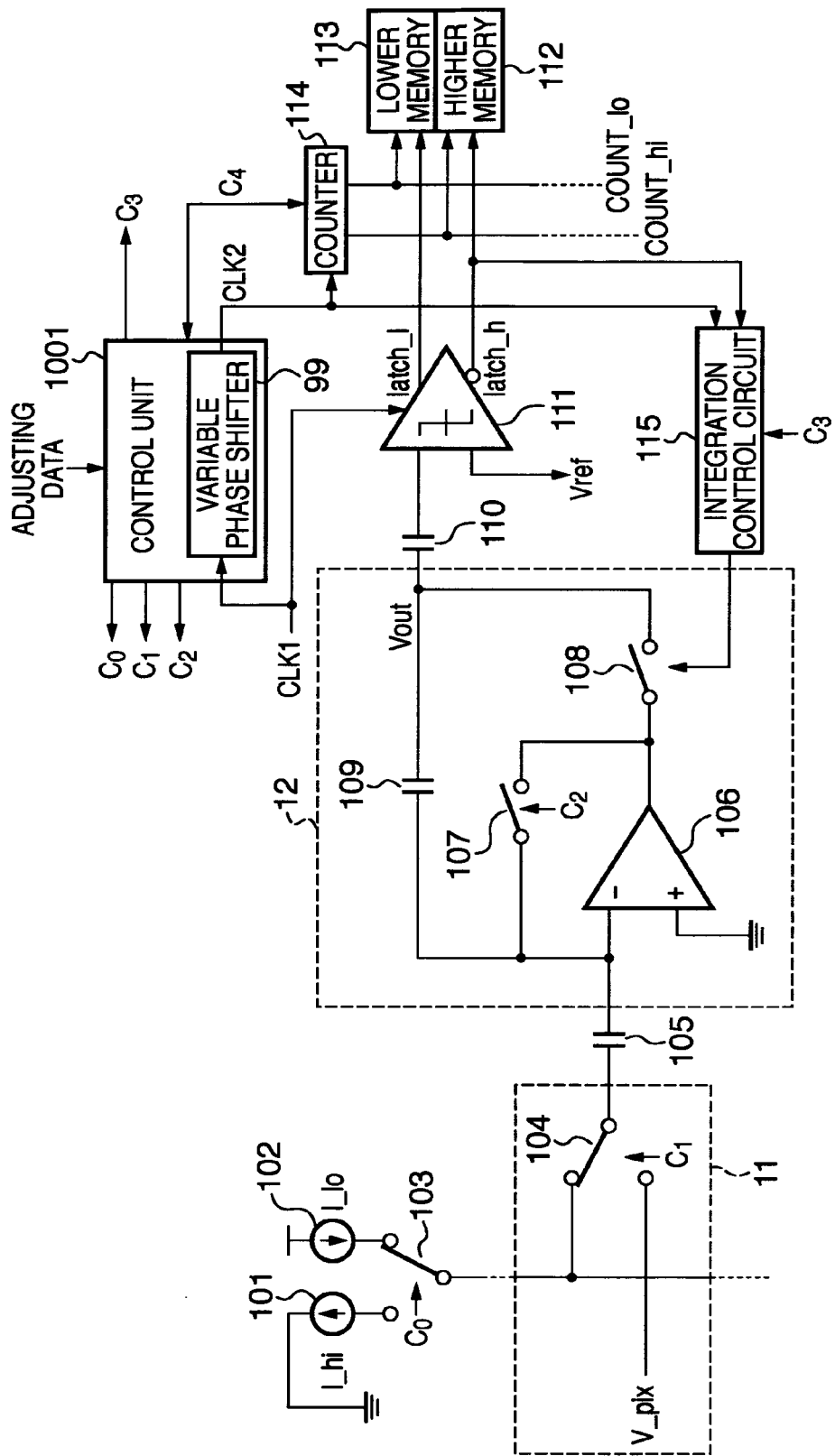
FIG. 2 is a circuit diagram for explaining the first embodiment.

FIG. 2 is a circuit diagram showing the arrangement of the A/D converting circuit 3 according to the first embodiment, which performs two-step A/D conversion, that is, higher conversion and lower conversion. A higher current source circuit 101 serving as a first current source and a lower current source circuit 102 serving as a second current source change the voltage level held by an integrating circuit 12 constructing a holding unit at a first slope $\Delta V1/\Delta t1$ and a second slope $\Delta V2/\Delta t2$ shown in FIG. 3, respectively. The higher current source circuit 101 and the lower current source circuit 102 supply currents I_hi and I_lo to the integrating circuit 12, respectively. The values of these currents determine a first rate and a second rate lower than the first rate. The expression "supply a current" includes both an operation of flowing a current to the integrating circuit 12 and an operation of drawing a current from the integrating circuit 12. When performing lower conversion of M bits, I_hi=−I_lo×2M. A switch 103 controlled by a control signal $C_0$ from a control unit 1001 selects one of the higher current source circuit 101 and the lower current source circuit 102. A switch 104 controlled by a control signal $C_1$ from the control unit 1001 selects one of the selected current source and the pixel output V_pix. The signal selected by the switch 104 is supplied to the integrating circuit 12 constructing the holding unit via an input capacitance 105. The integrating circuit 12 includes an operational amplifier 106, a reset switch 107 controlled by a control signal $C_2$ from the control unit 1001, an integration control switch 108 controlled by an integration control circuit 115, and an integration capacitance 109.

The output of the integrating circuit 12 is provided to a node Vout and supplied to a comparator 111 via a connection capacitance 110. The comparator 111 compares the output of the integrating circuit 12 with a reference voltage Vref at the leading edge of a clock signal CLK1. When the output of the integrating circuit 12 is less than the reference voltage Vref, the comparator 111 outputs a signal latch_h. When the output of the integrating circuit 12 is more than the reference voltage Vref, the comparator 111 outputs a signal latch_l. The outputs latch_h and latch_l are supplied to a higher memory 112 and a lower memory 113, respectively. A counter 114 is controlled by a clock signal CLK2 whose phase is adjusted by a variable phase shifter 99 and a control signal $C_4$ from the control unit 1001. The counter 114 supplies a higher count value COUNT_hi and a lower count value COUNT_lo to the higher memory 112 and the lower memory 113, respectively. The higher memory 112 and the lower memory 113 respectively hold count values when the signals latch_h and latch_l are input. The final digital signal output of A/D conversion is a value obtained by combining higher bits as the value of the higher memory 112 and lower bits as the value of the lower memory 113.

The integration control circuit 115 on/off-controls the integration control switch 108. The integration control circuit 115 operates based on the clock signal CLK2 and a control signal $C_3$ from the control unit 1001 so as to turn off the integration control switch 108 at the leading edge of the clock signal CLK2 after the signal latch_h is input. The integration control circuit 115 also turns on the integration control switch 108 at the leading edge of the clock signal CLK2 input from the variable phase shifter 99 after the control signal $C_3$ has gone high. Referring to FIG. 2, a write unit 11 sets, via the switch 104, the pixel output V_pix in the integrating circuit 12 constructing the holding unit as the initial value.

Figure 3:
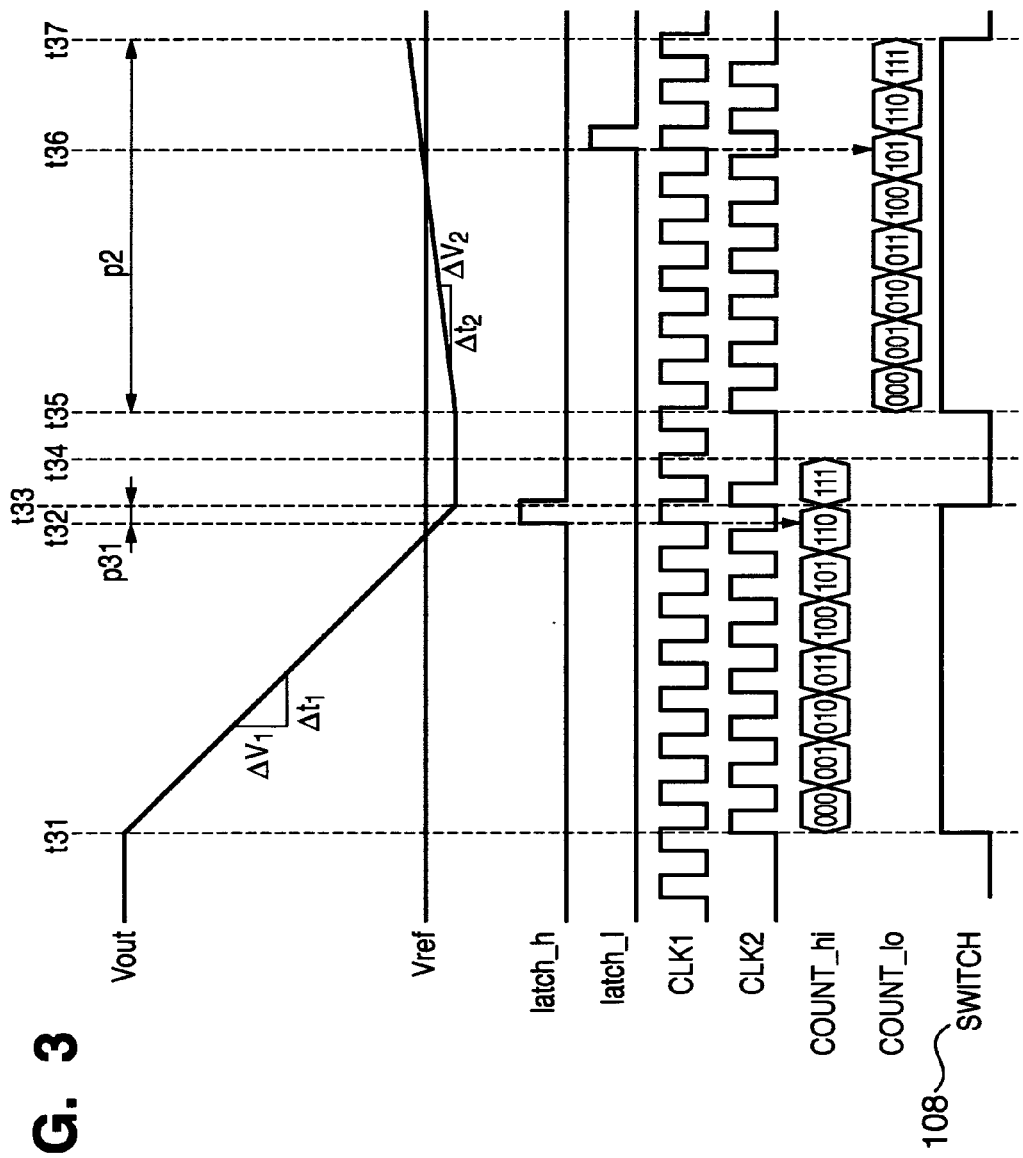
FIG. 3 is a timing chart showing the driving timing and operation waveforms in FIG. 2.

FIG. 3 is a timing chart showing the driving timing and operation waveforms of the driving state in FIG. 2. Referring to FIG. 3, Vout represents the potential of the node Vout in FIG. 2. An operation of causing the A/D converting circuit 3 to A/D-convert the analog pixel signal V_pix output from the imaging unit 2 in a normal imaging operation will be described first. The switch 104 included in the write unit 11 selects the pixel signal V_pix to supply it to the integrating circuit 12. The node Vout is charged by the pixel signal V_pix. At time t31, the integration control circuit 115 turns on the integration control switch 108 in synchronism with the leading edge of the clock signal CLK2 to start an integrating operation to determine higher bits. At this time, since the switches 103 and 104 select the higher current source circuit 101 as the input to the integrating circuit 12, the integrating circuit 12 is discharged by the higher current I_hi to lower the voltage level of the node Vout. An operation of changing the voltage level of the integrating circuit 12 from the initial level set at the pixel output V_pix at the first slope (first rate) (=−$\Delta V1/\Delta t1$) is thus performed. The comparator 111 performs comparison at the leading edge of the clock signal CLK1. For this reason, at time t32 corresponding to the first leading edge of the clock signal CLK1 after the voltage level of the node Vout falls below the reference voltage Vref, that is, after the voltage relationship has been inverted, the comparator 111 inverts the comparison result and outputs the signal latch_h of high level. Upon receiving the signal latch_h of high level, the higher memory 112 holds the count value at that point of time. The count value is determined as the higher bit value. On the other hand, the integration control circuit 115 turns off the integration control switch 108 at the leading edge of the clock signal CLK2 after the signal latch_h of high level has been input so as to stop the integrating operation at time t33. Time t34 is the timing the higher bits of the counter 114 are "111", and corresponds to the end time of higher conversion. At time t35 after the higher bit determination, the switch 103 is connected to the lower current source circuit 102, and the integration control switch 108 is turned on again to start the integrating operation for determining lower bits. An operation of changing the output voltage level of the integrating circuit 12, which intersects the reference voltage Vref so as to generate a difference from the reference voltage Vref, at the second slope (second rate) (=+$\Delta V2/\Delta t2$) is thus performed. At time t36, the output voltage level of the integrating circuit 12 exceeds the reference voltage Vref (that is, the voltage relationship is inverted again). Hence, the comparator 111 inverts the comparison result again and outputs the signal latch_l of high level. Upon receiving the signal latch_l of high level, the lower memory 113 holds the count value at that point of time. Time t37 is the timing the lower bits of the counter 114 are "111", and corresponds to the end time of lower conversion.

In this embodiment, the comparator 111 and the integration control switch 108 operate based on the clock signals CLK1 and CLK2. This applies an offset to the generation amount of the difference between the reference voltage Vref and the output voltage level of the integrating circuit 12 during a period p31 from the time t32 at which comparison is performed to the time t33 at which the integrating operation stops. The variable phase shifter 99 can adjust the period p31 by changing the timings of the clock signals CLK1 and CLK2. The variable phase shifter 99 includes, for example, a DLL circuit. The offset amount to be applied to the residual signal that is the difference between the output voltage level of the integrating circuit 12 to be provided to the node Vout and the reference voltage Vref serving as the reference level can be adjusted by the length of the period p31. This enables adjustment to end lower determination within a lower conversion period p2 and consequently allows the suppression of degradation of linearity.

In this example, control is done using the clock signals CLK1 and CLK2. However, the two clock signals may be generated by delaying one clock signal. Alternatively, the period p31 may be generated using the leading and trailing edges of one clock signal.

Figure 4A:
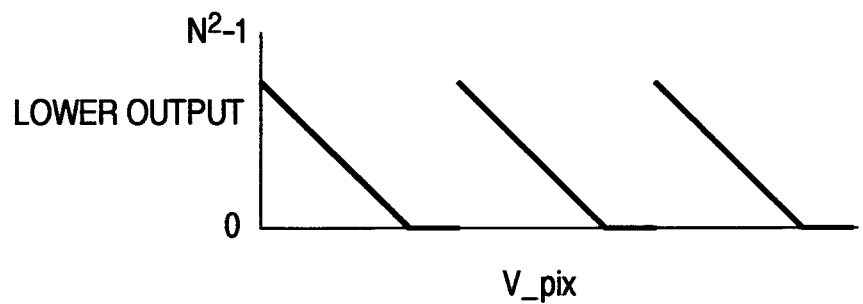
FIGS. 4A to 4C are timing charts for explaining an over-range state.
Figure 4B:
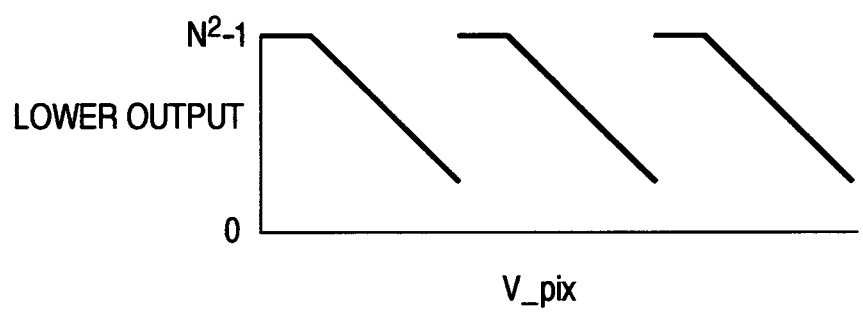
Figure 4C:
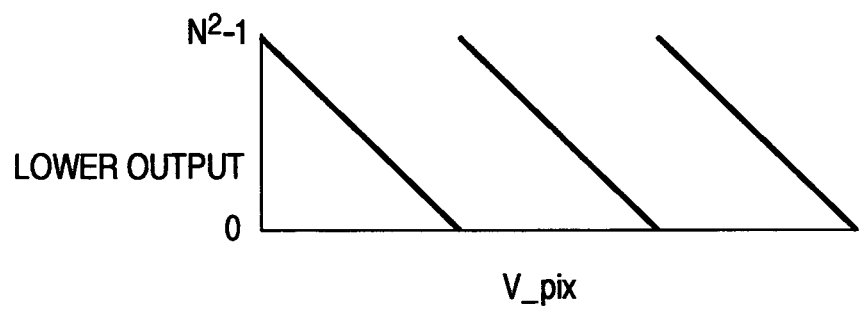

As the method of determining the adjusting amount of the residual signal, there exists a method of determining the adjusting amount based on the lower output (lower bit output) upon sweeping the input. FIGS. 4A to 4C show lower outputs in overrange states and within an appropriate range. In FIG. 4A, a minimum output continues. In this case, since the residual signal is smaller than the ideal, overrange occurs (lower determination is performed in only the first half of the lower conversion period p2 in FIG. 3). Similarly, FIG. 4B shows that a maximum output continues. Since the residual signal is larger than the ideal, overrange occurs (lower determination is performed in only the second half of the lower conversion period p2 in FIG. 3). That is, the lower bits nonlinearly change within the change range of the outputs of the photoelectric conversion elements, as can be seen. To the contrary, FIG. 4C illustrates an operation within an appropriate range, and the minimum output or maximum output does not continue. More specifically, the relationship between the value of the outputs of the photoelectric conversion elements and the value of the lower signal of the digital signal linearly changes throughout the possible range of the value of the outputs of the photoelectric conversion elements (lower determination is performed throughout the lower conversion period p2 in FIG. 3), as is apparent. This state is assumed to be ideal. Hence, if the minimum output continues, adjustment is done to increase the residual signal. Conversely, if the maximum output continues, adjustment is done to decrease the residual signal. An appropriate adjusting amount can be obtained by continuing the adjustment until the minimum or maximum output stops continuing.

In the first embodiment, when the minimum output continues upon sweeping the input, the period p31 is gradually prolonged. The period p31 obtained when the minimum output has stopped continuing is appropriate as the adjusting amount.

Figure 5:
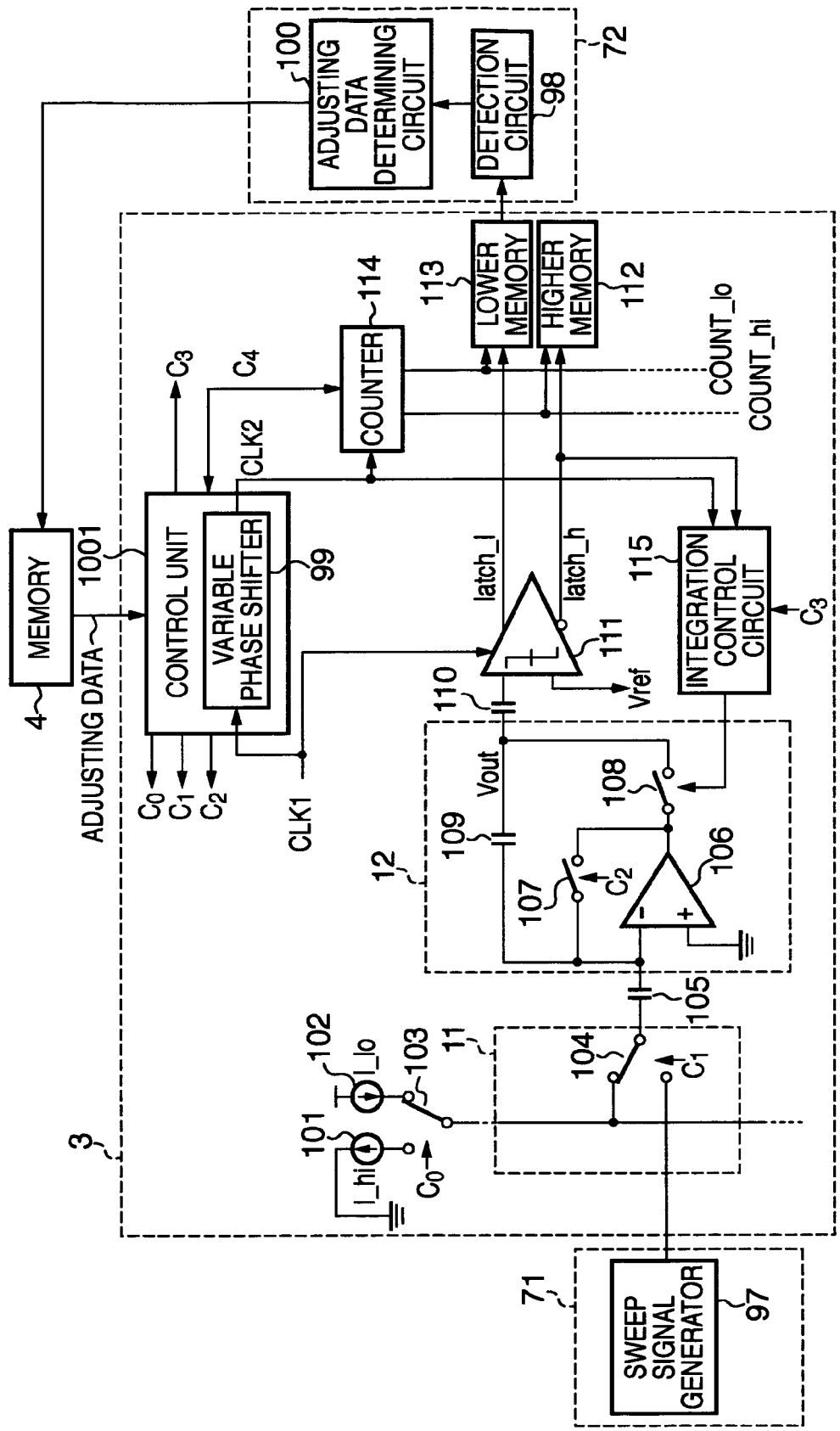
FIG. 5 is a circuit diagram for explaining a difference adjusting method according to the present invention.

A method of adjusting the period p31 at the time of calibration will be described next with reference to FIG. 5. For example, when shipping from the factory, a sweep signal generator 97 that can be provided in the providing unit 71 of the adjusting device 7 shown in FIG. 1 can supply a continuously changing sweep signal to the integrating circuit 12 (FIG. 2). More specifically, the sweep signal generator 97 sequentially supplies a plurality of voltage levels to the integrating circuit 12 to perform higher and lower A/D conversion. The signal from the lower memory 113 is supplied to a detection circuit 98 that can be provided in the processing unit 72 of the adjusting device 7 shown in FIG. 1 so that the detection circuit 98 detects the degree of continuation of the maximum or minimum value in the lower signal. An adjusting data determining circuit 100 having, for example, an LUT (lookup table) can determine the adjusting data in accordance with the output from the detection circuit 98. The adjusting data is stored in the memory 4. Note that the detection circuit 98 and the adjusting data determining circuit 100 can be provided in the processing unit 72 of the adjusting device 7 shown in FIG. 1. The variable phase shifter 99 constructing the difference control circuit can be controlled by the output of the adjusting data determining circuit 100. More specifically, the phase difference between the clock signals CLK1 and CLK2 is controlled to change the period p31 so that an ideal residual signal is obtained. As described above, if the minimum output continues, the period p31 is gradually prolonged. Conversely, if the maximum output continues, the period p31 is gradually shortened. The period p31 is controlled such that when the adjusting device 7 sequentially supplies the plurality of voltage levels, the voltage level and the digital signal output from the A/D converting circuit 3 hold a linearly relationship throughout the possible range of the voltage level. This implements the relationship as shown in FIG. 4C. Data of the thus obtained period p31 is stored in the memory 4 shown in FIG. 1 or 5. In the normal operation of the imaging device 8, the data of the period p31 stored in the memory 4 is used as adjusting data. Note that the adjusting data to be stored in the memory 4 may be generated for each column in the pixel area and stored at different addresses. Alternatively, adjusting data common to all columns may be stored. The above-described adjusting method is applicable to any embodiment other than the first embodiment.

Figure 6:
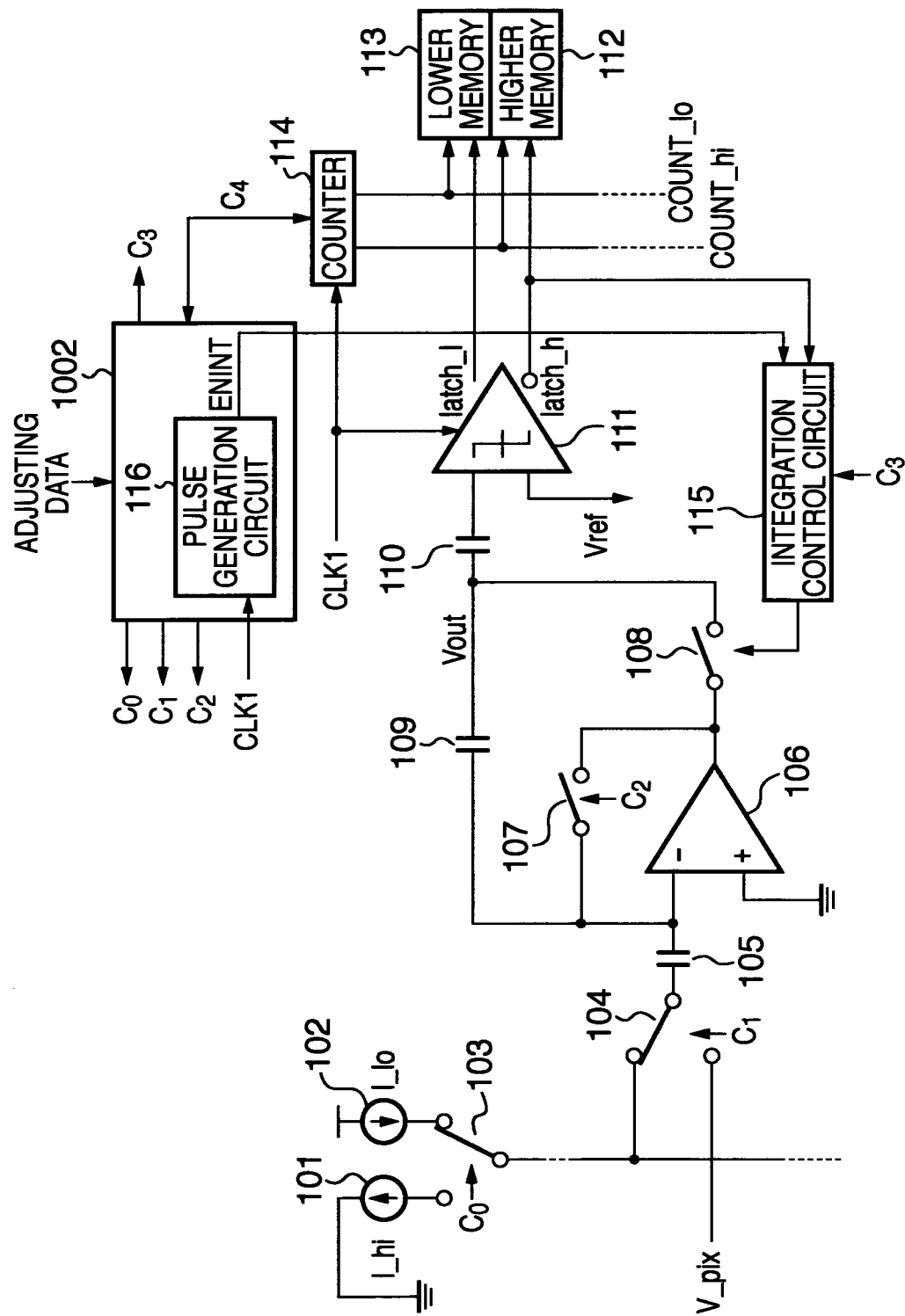
FIG. 6 is a circuit diagram for explaining the second embodiment.

FIG. 6 is a circuit diagram showing the arrangement of an A/D converting circuit 3 according to the second embodiment. The difference from FIG. 2 will be explained. Referring to FIG. 6, a comparator 111 and a counter 114 are controlled by a common clock signal CLK1. A control unit 1002 of the second embodiment includes a pulse generation circuit 116. An integration control circuit 115 controls the start of the integrating operation based on the leading edge of a pulse ENINT generated by the pulse generation circuit 116 and the stop of the integrating operation based on the leading edge of a signal latch_h. In the second embodiment, the start of count by the counter 114 at the time of lower conversion is controlled by a control signal $C_4$ so as to ensure a delay from the end of count by the counter 114 in higher conversion, and output of the pulse ENINT is controlled during that time. The remaining components are the same as in FIG. 2.

Figure 7:
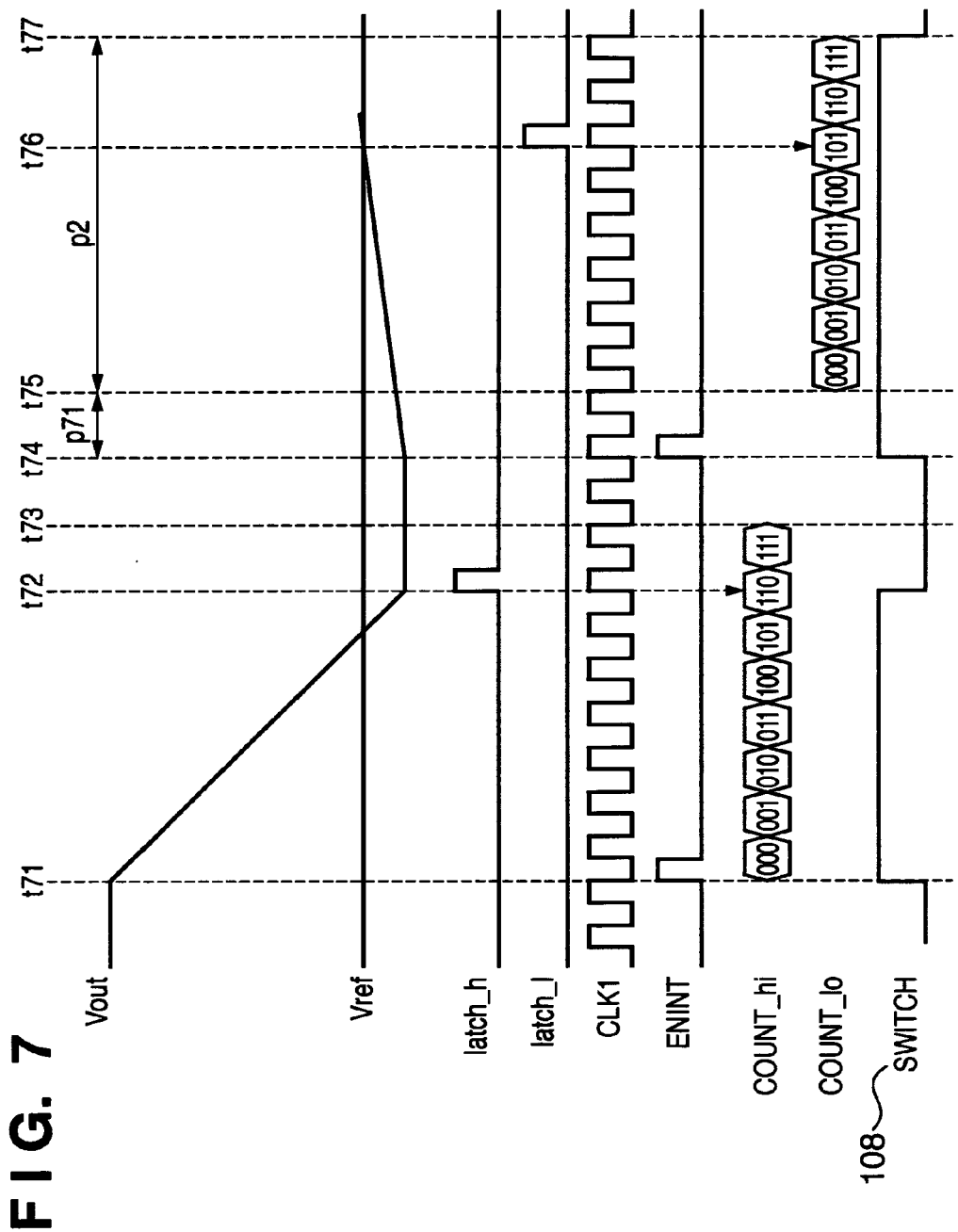
FIG. 7 is a timing chart showing the driving timing and operation waveforms in FIG. 6.

FIG. 7 is a timing chart showing the driving timing and operation waveforms of the driving state in FIG. 6. A node Vout is charged in advance by the pixel output. At time t71, the pulse ENINT of high level is input to the integration control circuit 115 to turn on an integration control switch 108 to start the integrating operation of higher bits. Simultaneously, the counter 114 starts the count operation. At this time, since switches 103 and 104 select a higher current source circuit 101 to supply a current to an input capacitance 105, the integrating circuit is discharged by a higher current I_hi to lower the potential of the node Vout. The comparator 111 performs comparison at the leading edge of the clock signal CLK1. For this reason, at time t72 corresponding to the first leading edge of the clock signal CLK1 after the potential of the node Vout falls below a reference voltage Vref, the comparator 111 inverts the comparison result and outputs the signal latch_h of high level. Upon receiving the signal latch_h of high level, a higher memory 112 holds the count value at that point of time. Upon receiving the signal latch_h of high level simultaneously, the integration control circuit 115 turns off the integration control switch 108 to stop the integrating operation. Time t73 is the timing the higher bits of the counter 114 are "111", and corresponds to the end time of higher conversion.

After that, the switch 103 is connected to a lower current source circuit 102. At time t74, the pulse ENINT rises, and the integration control switch 108 is turned on again to start lower integration. At this time, the counter 114 does not operate in synchronism with turning on the integration control switch 108. The count operation starts at time t75 after the elapse of a period p71 from the time t74. The period p71 is determined by the time t74 the pulse ENINT is generated (the number of clock signals CLK1 from the time t71 the preceding pulse ENINT has been generated).

At time t76, the comparator 111 inverts the comparison result again and outputs a signal latch_l of high level. Upon receiving the signal latch_l of high level, a lower memory 113 holds the count value. Time t77 is the timing the lower bits of the counter 114 are "111", and corresponds to the end time of lower conversion.

In this embodiment, the offset amount of the residual signal can be adjusted by the length of the period p71 from the lower bit integration start time t74 to the count start time t75. Adjusting the period p71 to a value corresponding to the difference from the ideal value of the residual signal enables adjustment to perform conversion within a lower conversion period p2 and consequently allows to suppress degradation of linearity. The adjusting amount determining method is the same as that described in the first embodiment. More specifically, a sweep signal generator 97, detection circuit 98, and adjusting data determining circuit 100 are provided, as in the first embodiment. An input V_pix to the integrating circuit is swept by a sweep signal supplied from the sweep signal generator 97 provided in a providing unit 71 and continuously changed. The detection circuit 98 detects the output from the lower memory 113 at this time. The detection circuit 98 detects the degree of continuation of the maximum or minimum value in the lower signal. The adjusting data determining circuit 100 determines adjusting data in accordance with the output from the detection circuit 98. Note that the detection circuit 98 and the adjusting data determining circuit 100 are provided in a processing unit 72 of an adjusting device 7 shown in FIG. 1. The adjusting data is supplied to the pulse generation circuit 116 to control the timing of the pulse ENINT, thereby adjusting the period p71. Data of the thus obtained period p71 is stored in a memory 4 shown in FIG. 1. In the normal operation of an imaging device 8, the data of the period p71 stored in the memory 4 is used as adjusting data to control the timing of the pulse ENINT. Note that in the second embodiment, the count start time t75 of the counter 114 in lower conversion by the control signal $C_4$ or the count start time t75 and the timing t74 of the pulse ENINT may be adjusted together.

Figure 8:
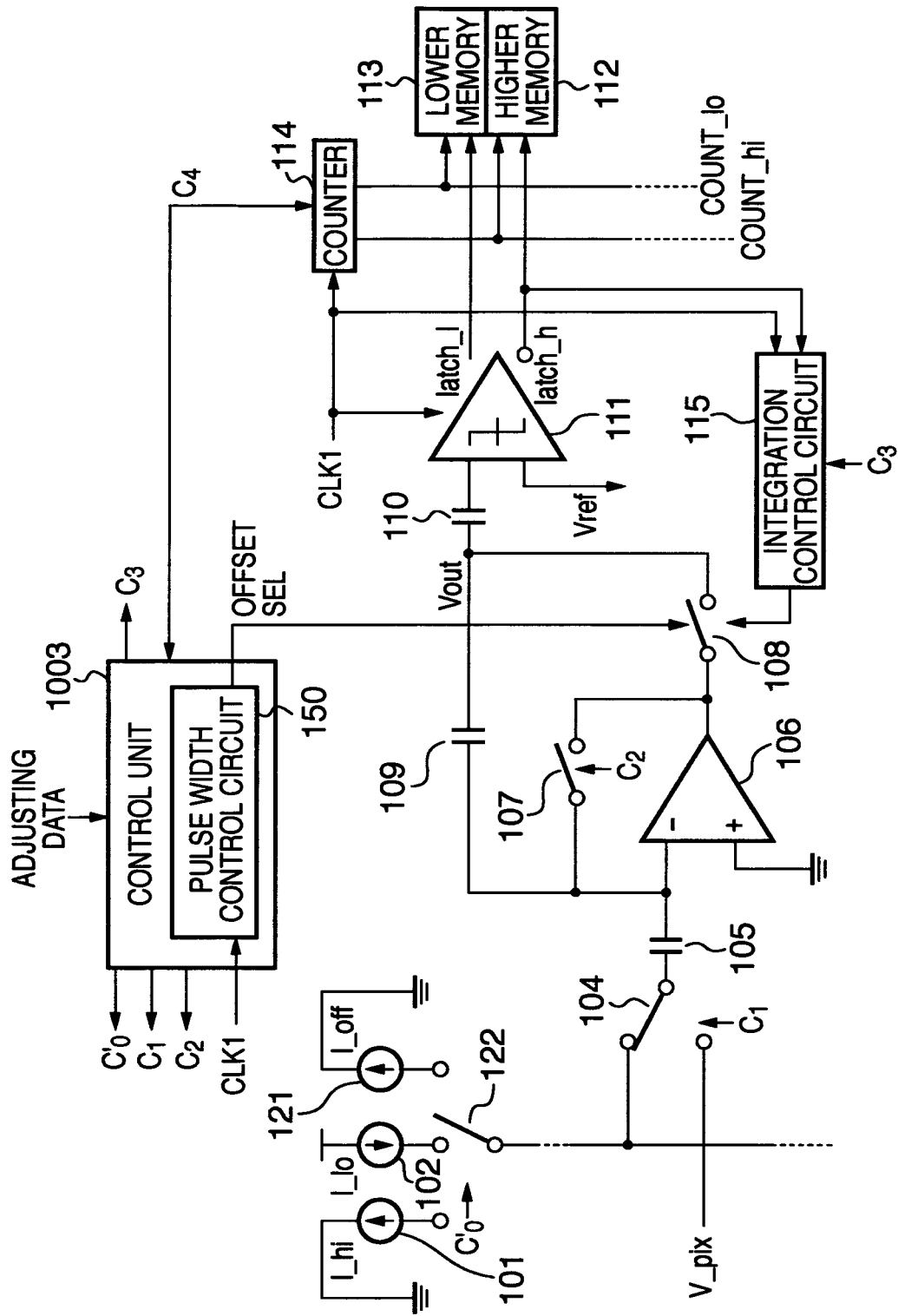
FIG. 8 is a circuit diagram for explaining the third embodiment.

FIG. 8 is a circuit diagram showing an example of the arrangement of an A/D converting circuit 3 according to the third embodiment. The difference from FIG. 2 will be explained. Referring to FIG. 8, an offset current source circuit 121 is provided in addition to a higher current source circuit 101 and a lower current source circuit 102. A current I_off supplied by the offset current source circuit 121 has an arbitrary value. A switch 122 controlled by a control signal $C'_O$ from a control unit 1003 selects one of the current source circuits 101, 102, and 121. An integration control switch 108 is controlled by a signal from an integration control circuit 115 driven by signals CLK1 and latch_h and also by a signal from a pulse width control circuit 150 provided in the control unit 1003. The integration control switch 108 in FIG. 8 is connected if one of the signal from the integration control circuit 115 and the signal from the pulse width control circuit 150 is at high level. In the third embodiment, the start of count by a counter 114 at the time of lower conversion is controlled by a control signal $C_4$ so as to ensure a delay from the end of count by the counter 114 in higher conversion, and output of the signal from the pulse width control circuit 150 is controlled during that time. The remaining components are the same as in FIG. 2.

Figure 9:
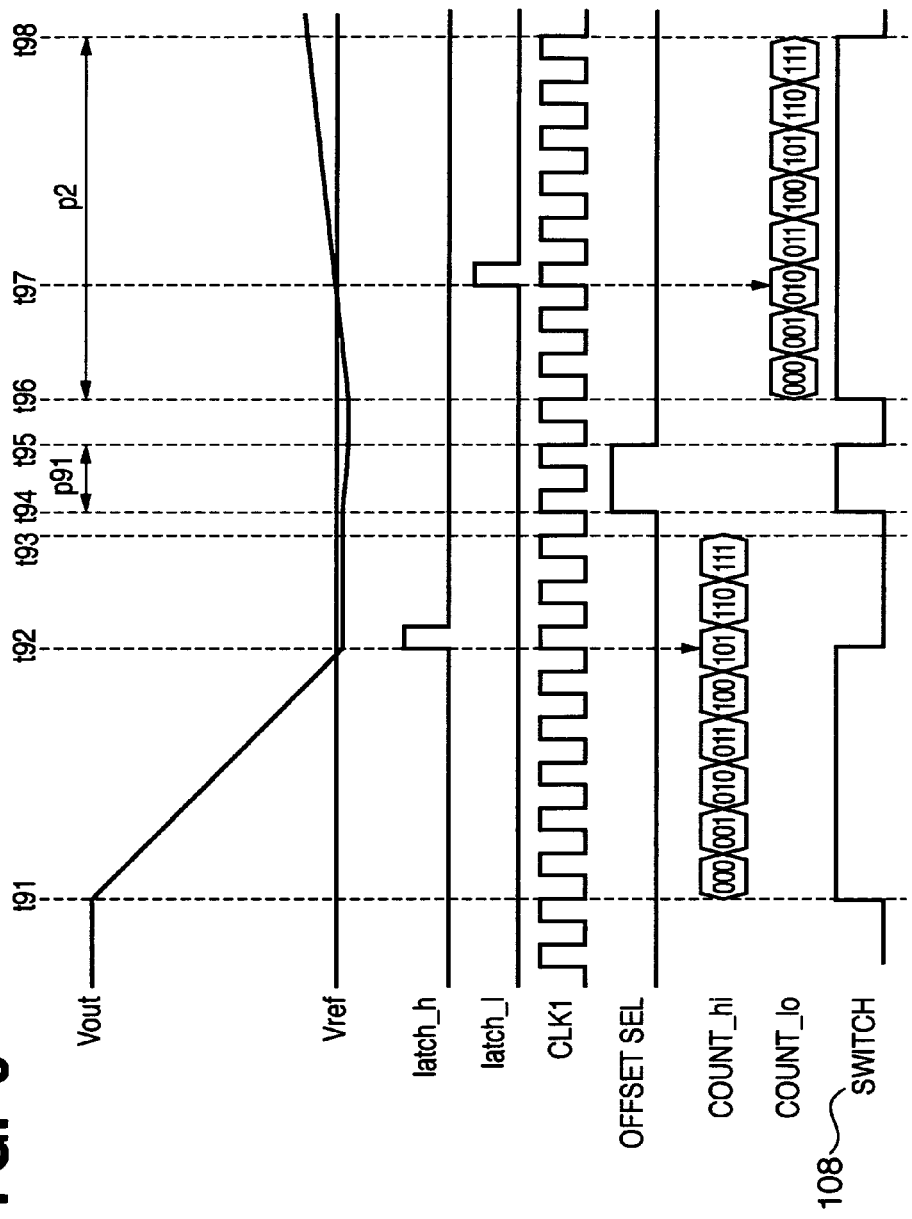
FIG. 9 is a timing chart showing the driving timing and operation waveforms in FIG. 8.

FIG. 9 is a timing chart showing the driving timing and operation waveforms of the driving state in FIG. 8. A node Vout is charged in advance by the pixel output. At time t91, the integration control circuit 115 turns on the integration control switch 108 in synchronism with the clock signal CLK1 to start the integrating operation of higher bits. Simultaneously, the counter 114 starts the count operation. At this time, since the switches 122 and 104 select the higher current source circuit 101 to supply a current to an input capacitance 105, the integrating circuit is discharged by a higher current I_hi to lower the potential of the node Vout. A comparator 111 performs comparison at the leading edge of the clock signal CLK1. For this reason, at time t92 corresponding to the first leading edge of the clock signal CLK1 after the potential of the node Vout falls below a reference voltage Vref, the comparator 111 inverts the comparison result and outputs the signal latch_h of high level. Upon receiving the signal latch_h of high level, a higher memory 112 holds the count value at that point of time. Upon receiving the signal latch_h of high level simultaneously, the integration control circuit 115 turns off the integration control switch 108 to stop the integrating operation. Time t93 is the timing the higher bits of the counter 114 are "111", and corresponds to the end time of higher conversion.

After that, the switch 122 is connected to the offset current source circuit 121. At time t94, a signal OFFSET SEL output from the pulse width control circuit 150 falls to turn on the integration control switch. After a period p91 where the signal OFFSET SEL is at high level, offset integration stops at time t95. Then, the switch 122 is connected to the lower current source circuit 102, and integration of lower bits and lower count start at time t96.

At time t97, the comparator 111 inverts the comparison result again and outputs a signal latch_l of high level. Upon receiving the signal latch_l of high level, a lower memory 113 holds the count value. Time t98 is the timing the lower bits of the counter 114 are "111", and corresponds to the end time of lower conversion.

In this embodiment, a period where the offset current I_off supplied by the offset current source circuit 121 serving as a third current source is injected is provided between higher conversion and lower conversion so that integration is performed during the period p91 using the arbitrary offset current I_off. Hence, the lower residual amount can be adjusted by the changing the period p91. Adjusting the period p91 to a value corresponding to the difference from the ideal value of the lower residual signal enables adjustment to end lower determination within a lower conversion period p2 and consequently allows to suppress degradation of linearity. As a detailed adjusting method, an input V_pix to the integrating circuit is swept and continuously changed, as described above. More specifically, a plurality of voltage levels are sequentially supplied to the integrating circuit of the A/D converting circuit. A detection circuit 98 detects the output from the lower memory 113 at this time. The detection circuit 98 detects the degree of continuation of the maximum or minimum value in the lower signal. An adjusting data determining circuit 100 determines adjusting data in accordance with the output from the detection circuit 98. The detection circuit 98 and the adjusting data determining circuit 100 can be provided in a processing unit 72 of an adjusting device 7 shown in FIG. 1. The adjusting data is supplied to the pulse width control circuit 150 which controls the pulse width of the signal OFFSET SEL. The integration control switch 108 can be controlled by the output of the pulse width control circuit 150 to control the integration period p91 by the offset current I_off. Data of the thus obtained period p91 is stored in a memory 4 shown in FIG. 1. In the normal operation of an imaging device 8, the data of the period p91 stored in the memory 4 is used as adjusting data.

Figure 10:
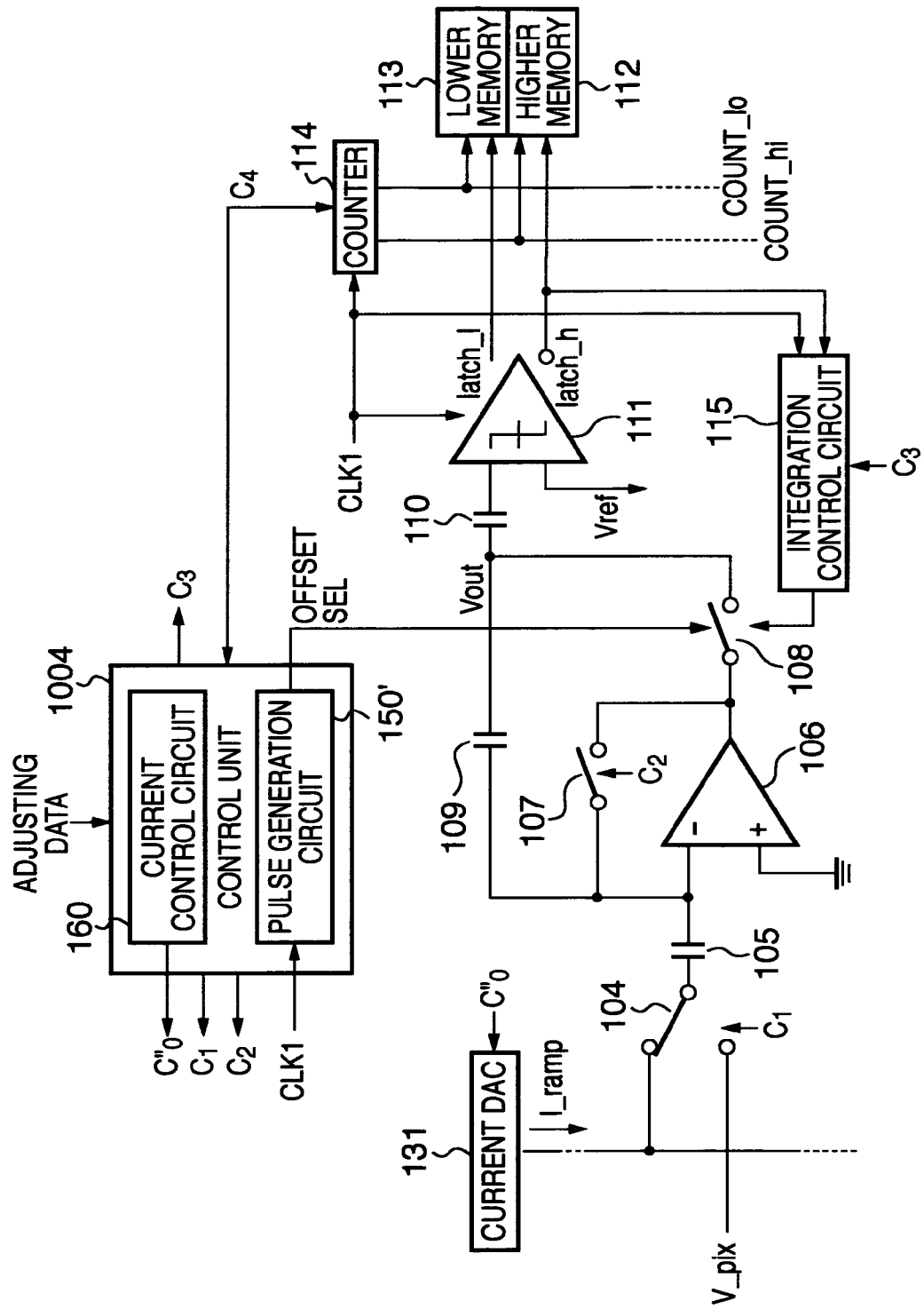
FIG. 10 is a circuit diagram for explaining the fourth embodiment.

FIG. 10 is a circuit diagram of an A/D converting circuit 3 according to the fourth embodiment. The difference from FIG. 8 will be explained. Referring to FIG. 10, a current DAC 131 is used as a current source circuit to supply an arbitrary current. An example of the current DAC 131 is a circuit for supplying a current corresponding to a digital control signal $C''_0$ from outside. In the fourth embodiment, a control unit 1004 includes a pulse generation circuit 150' for a fixed pulse width, and a current control circuit 160 which generates the control signal $C''_0$ to adjust the current of the current DAC 131 in accordance with adjusting data. The remaining components are the same as in FIG. 8.

Figure 11:
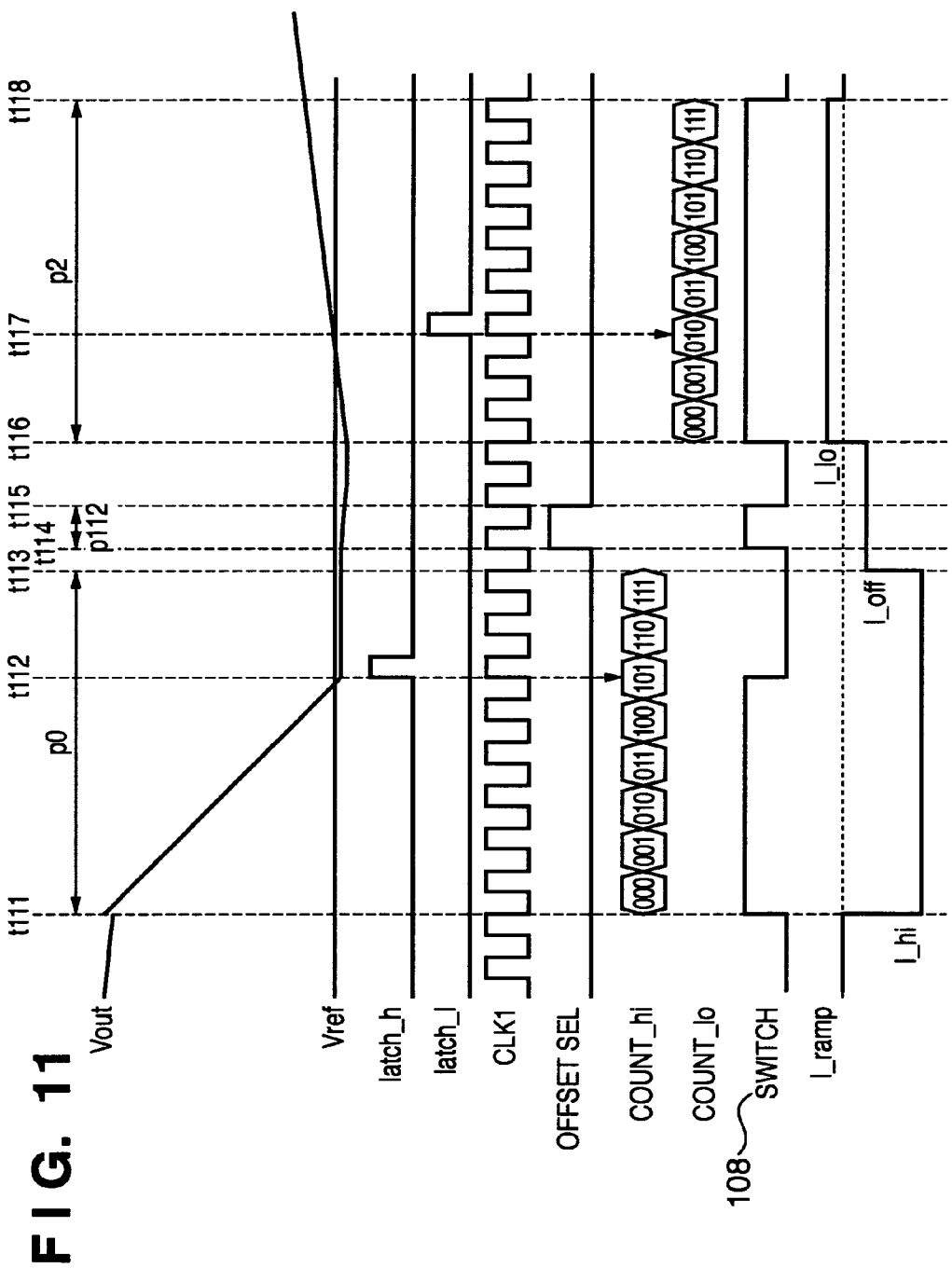
FIG. 11 is a timing chart showing the driving timing and operation waveforms in FIG. 10.

FIG. 11 is a timing chart showing the driving timing and operation waveforms of the driving state in FIG. 10. A node Vout is charged in advance by the pixel output. At time t111, an integration control circuit 115 turns on an integration control switch 108 in synchronism with a clock signal CLK1 to start the integrating operation of higher bits. The current DAC 131 supplies a higher current I_hi during a period p0. After higher determination at time t112, higher conversion ends at time t113 that is the timing the higher bits of a counter 114 are "111". At time t114, a signal OFFSET SEL of high level turns on the integration control switch 108 to perform the integrating operation during a period p112. The period p112 can be fixed. During the period p112, the current DAC 131 supplies an arbitrary current I_off determined by the control signal $C''_0$.

At time t115, the integrating operation by the offset current stops. At time t116, the integrating operation of lower bits starts. At time t117, lower determination is performed. During a period p2, the current DAC 131 supplies a lower current I_lo. When performing lower conversion of M bits, I_hi=−I_lo×2M. Using the current DAC 131 enables to set the current I_off to be supplied during the period p112 to an arbitrary value and adjust the residual amount. Adjusting the current I_off to a value corresponding to the difference from the ideal value of the lower residual signal enables adjustment to end lower determination within the lower conversion period p2 and consequently allows to suppress degradation of linearity. As a detailed adjusting method, an input V_pix to the integrating circuit is swept and continuously changed, as described above. More specifically, a plurality of voltage levels are sequentially supplied to the integrating circuit of the A/D converting circuit. A detection circuit 98 detects the output from a lower memory 113 at this time. The detection circuit 98 detects the degree of continuation of the maximum or minimum value in the lower signal. An adjusting data determining circuit 100 determines adjusting data in accordance with the output from the detection circuit 98. Note that the detection circuit 98 and the adjusting data determining circuit 100 are provided in a processing unit 72 of an adjusting device 7 shown in FIG. 1. The adjusting data is supplied to the current DAC 131 to control the current I_off, thereby performing adjustment. Data of the thus obtained current value I_off is stored in a memory 4 shown in FIG. 1. In the normal operation of an imaging device 8, the data of the current I_off stored in the memory 4 is used as adjusting data.

An A/D converting circuit 3 according to the fifth embodiment will be explained next. In the fifth embodiment, redundancy bits are used in lower conversion. That is, the number of lower bits is changeable. The circuit diagram to be used in the description of this embodiment is the same as FIG. 2. However, lower count by a counter 114 is done using (M+1) bits by adding one redundancy bit to the M bit accuracy of higher count. Hence, the lower output is (M+1) bits. The LSB (Least Significant Bit) of the higher output corresponds to the MSB (Most Significant Bit) of the lower output. The current supplied from the current source circuit is I_hi=−I_lo×2M.

FIG. 12 is a timing chart showing the driving timing and operation waveforms of the driving state according to the embodiment. Vout_h and Vout_l are the maximum signal and minimum signal of an integration output Vout, respectively. At time t121, higher conversion starts. As for the integration output Vout, the comparator inverts the output at time t122 so that the higher count is stored in a higher memory 112. After that, after the elapse of a period p31 corresponding to the phase difference between clock signals CLK1 and CLK2, the integrating operation stops at time t123. At time t124 corresponding to the timing the higher bits of the counter 114 are "111", higher conversion ends. After that, at time t125, lower integration and count start. The comparator inverts the output at time t126 when the input is Vout_h and at time t127 when the input is Vout_l, and outputs signals latch_11 and latch_12. The signal latch_11 is the signal latch_1 output from the comparator 111 when Vout_h is used for conversion. The signal latch_12 is the signal latch_l output from the comparator 111 when Vout_l is used for conversion. Time t128 is the timing the lower bits of the counter 114 are "1111", and corresponds to the end time of lower conversion.

Ideally, lower conversion is done within the range of a period p22 from the time t126 to the time t127. However, the actual inversion timing distribution of the integrator is represented by the lower inversion timing distribution in FIG. 12 due to random noise or variations between ADCs. When the lower bits include redundancy bits, the period p31 is adjusted such that the distribution falls within a lower conversion period p21, thereby suppressing degradation of linearity.

In this embodiment, the residual signal adjusting function and lower bit redundancy are combined to suppress degradation of linearity even when the lower output varies. In addition, a lower residual signal adjusting accuracy is allowed.

In the above-described embodiments, only the read circuit corresponding to one column of the pixel array is shown. In the pixel array in which the pixels are arranged two-dimensionally, read circuits with the same arrangement are provided in parallel. In FIGS. 2, 6, 8, and 10, the higher current source circuit 101, lower current source circuit 102, and counter 114 are common to the plurality of read circuits. Note that though a current is supplied to the integrating circuit in the embodiments, the embodiments are also applicable to a multi-step type A/D converting circuit arrangement using a voltage.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures and functions.

This application claims the benefit of Japanese Patent Application No. 2010-005153, filed Jan. 13, 2010 and No. 2010-171177, filed Jul. 29, 2010, which are hereby incorporated by reference herein in their entirety.

The invention claimed is:

1. An imaging system including a plurality of pixels arranged in a matrix each of which outputs a pixel signal corresponding to incident light, and a plurality of A/D converting circuits provided in correspondence with columns of the plurality of pixels, the A/D converting circuit comprising:
a holding unit which holds the pixel signal as a voltage level;
a comparator which compares the voltage level held by the holding unit with a reference level; and
a circuit capable of changing the voltage level held by the holding unit so as to approach the reference level at one of a first rate and a second rate lower than the first rate, wherein the voltage level of the pixel signal held by the holding unit is changed by the circuit at the first rate, higher bits are determined in accordance with inversion of a relationship between the reference level and the voltage level held by the holding unit, after that, the voltage level held by the holding unit is changed at the second rate, and lower bits are determined in accordance with inversion of the relationship between the reference level and the voltage level held by the holding, and
the imaging system further comprising an adjusting unit which adjusts the voltage level held by the holding unit during a period until the voltage level held by the holding unit is changed at the second rate after determination of the higher bits so that the lower bits and the voltage level held by the holding unit hold a linear relationship throughout a possible range of the voltage level held by the holding unit after determination of the higher bits,
wherein the adjusting unit adjusts, during the period, the voltage level held by the holding unit, by causing the circuit to change the voltage level held by the holding unit at the first rate.

2. An imaging system including an imaging device, the imaging device comprising:
an imaging unit including a pixel area where a plurality of photoelectric conversion elements are arranged in a two-dimensional array;
an A/D converting circuit which converts an output of the imaging unit into a digital signal including higher bits and lower bits; and
a memory which stores adjusting data, and
the A/D converting circuit comprising:
a holding unit which holds a voltage level; and
a write unit which causes the holding unit to hold, as an initial level, a voltage level of a signal output from the imaging unit,
wherein the A/D converting circuit is configured to change the voltage level held by the holding unit from the initial level to a reference level at a first slope and to determine, as the higher bits, a count value of a counter which counts a time from timing when the change starts to timing when the voltage level intersects the reference level, and after the voltage level has intersected the reference level to generate a difference between the voltage level and the reference level, to change the voltage level to the reference level at a second slope and to determine, as the lower bits, a count value of the counter which counts a time from timing when the change at the second slope starts to timing when the voltage level intersects the reference level again, and wherein a generation amount of the difference is adjusted in accordance with the adjusting data stored in the memory, the imaging system further including an adjusting device comprising:
a providing unit which sequentially supplies a plurality of voltage levels to the A/D converting circuit and causes the A/D converting circuit to convert the plurality of voltage levels into digital signals; and
a processing unit which stores, in the memory, the adjusting data to be used to adjust the generation amount of the difference so that the plurality of voltage levels and values of the digital signals output from the A/D converting circuit upon receiving the plurality of voltage levels hold linearity throughout a possible range of the voltage level.

3. An imaging device including an imaging unit including a pixel area where a plurality of photoelectric conversion elements are arranged in a two-dimensional array, an A/D converting circuit which converts an output of the imaging unit into a digital signal including higher bits and lower bits, a memory which stores adjusting data, and an adjusting circuit, the A/D converting circuit comprising:
a holding unit which holds a voltage level; and
a write unit which causes the holding unit to hold, as an initial level, a voltage level of a signal output from the photoelectric conversion element,
wherein the A/D converting circuit is configured to change the voltage level held by the holding unit from the initial level to a reference level at a first slope and to determine, as the higher bits, a count value of a counter which counts a time from timing when the change starts to timing when the voltage level intersects the reference level, and after the voltage level has intersected the reference level to generate a difference between the voltage level and the reference level, to change the voltage level to the reference level at a second slope and to determine, as the lower bits, a count value of the counter which counts a time from timing when the change at the second slope starts to timing when the voltage level intersects the reference level again, and wherein a generation amount of the difference is adjusted in accordance with the adjusting data stored in the memory,
the adjusting data is data to be used to control the generation amount of the difference so that a plurality of voltage levels supplied to the A/D converting circuit and values of the digital signals output from the A/D converting circuit upon receiving the plurality of voltage levels hold linearity throughout a possible range of the voltage level, and
the adjusting circuit comprises a difference control circuit which controls the generation amount of the difference by reading out the adjusting data from the memory.

4. The device according to claim 3, wherein the A/D converting circuit further comprises a first current source and a second current source which respectively supply a first current and a second current, whose current value is different from that of the first current, to the holding unit, and changes the voltage level at the first slope and the second slope by supplying the first current and the second current to the holding unit.

5. The device according to claim 3, wherein the difference control circuit controls a phase of a clock signal which drives the A/D converting circuit.

6. The device according to claim 3, wherein the difference control circuit controls a time from timing when the change of the voltage level at the second slope starts to timing when the counter starts count.

7. The device according to claim 4, wherein the A/D converting circuit further comprises a third current source which changes the voltage level by supplying a current to the holding unit after the voltage level held by the holding unit has intersected the reference level when the voltage level is changed from the initial level to the reference level at the first slope and before the voltage level is changed to the reference level at the second slope, and the difference control circuit controls the generation amount of the difference by controlling a time period in which the third current source changes the voltage level.

8. The device according to claim 3, wherein the A/D converting circuit further comprises a current source which changes the voltage level by supplying a current to the holding unit after the voltage level held by the holding unit has intersected the reference level when the voltage level is changed from the initial level to the reference level at the first slope and before the voltage level is changed to the reference level at the second slope, and the difference control circuit controls the generation amount of the difference by controlling a value of the current to be supplied from the current source to the holding unit.

9. The device according to claim 3, wherein the A/D converting circuit is configured to be able to change the number of lower bits.

10. An imaging system including a plurality of pixels arranged in a matrix each of which outputs a pixel signal corresponding to incident light, and a plurality of A/D converting circuits provided in correspondence with columns of the plurality of pixels, wherein the A/D converting circuit generates first bits of a digital signal based on elapsed time, in response to inversion of a sign of a first difference associated with a difference between a first reference signal and the pixel signal, the first difference changing in time at a first rate, after that, the A/D converting circuit generates second bits of the digital signal based on elapsed time, in response to inversion of a sign of a second difference between a second reference signal and the first difference that has been changed at the first rate after the inversion of the sign of the first difference, the second difference changing time at a second rate lower than the first rate, and the imaging system further comprises an adjusting unit configured to adjust an amount of change of the first difference that has been changed at the first rate after the inversion of the sign of the first difference.

* * * * *